United States Patent
Fix et al.

(10) Patent No.: US 7,064,345 B2
(45) Date of Patent: Jun. 20, 2006

(54) ORGANIC FIELD EFFECT TRANSISTOR WITH OFF-SET THRESHOLD VOLTAGE AND THE USE THEREOF

(75) Inventors: Walter Fix, Nürnberg (DE); Andreas Ullmann, Fürth (DE)

(73) Assignee: Siemens Aktiengesellschaft, Munich (DE)

( * ) Notice: Subject to any disclaimer, the term of this patent is extended or adjusted under 35 U.S.C. 154(b) by 96 days.

(21) Appl. No.: 10/498,610

(22) PCT Filed: Sep. 12, 2002

(86) PCT No.: PCT/DE02/04520
§ 371 (c)(1),
(2), (4) Date: Jun. 10, 2004

(87) PCT Pub. No.: WO03/054970
PCT Pub. Date: Jul. 3, 2003

(65) Prior Publication Data
US 2005/0211972 A1    Sep. 29, 2005

(30) Foreign Application Priority Data
Dec. 11, 2001   (DE) ................................ 101 60 732

(51) Int. Cl.
*H01L 35/24* (2006.01)
*H01L 51/00* (2006.01)

(52) U.S. Cl. .................... 257/40; 257/67; 257/E51.022

(58) Field of Classification Search .................... None
See application file for complete search history.

(56) References Cited

U.S. PATENT DOCUMENTS

| | | | |
|---|---|---|---|
| 3,512,052 A | 5/1970 | MacIver et al. | |
| 3,769,096 A | 10/1973 | Ashkin | |
| 3,955,098 A | 5/1976 | Kawamoto | |
| 4,302,648 A | 11/1981 | Sado et al. | |
| 4,340,657 A | 7/1982 | Rowe | |
| 4,442,019 A | 4/1984 | Marks | |
| 4,865,197 A | 9/1989 | Craig | |
| 4,937,119 A | 6/1990 | Nickles et al. | |
| 5,173,835 A | 12/1992 | Cornett et al. | |
| 5,206,525 A | 4/1993 | Yamamoto et al. | |
| 5,259,926 A | 11/1993 | Kuwabara et al. | |
| 5,321,240 A | 6/1994 | Takahira | |
| 5,347,144 A | 9/1994 | Garnier et al. | |
| 5,364,735 A | 11/1994 | Akamatsu et al. | |
| 5,395,504 A | 3/1995 | Hoffman et al. | |
| 5,480,839 A | 1/1996 | Ezawa et al. | |
| 5,486,851 A | 1/1996 | Gehner et al. | |
| 5,502,396 A | 3/1996 | Desarzens | |
| 5,546,889 A | 8/1996 | Wakita et al. | |

(Continued)

FOREIGN PATENT DOCUMENTS

DE    33 38 597    5/1985

(Continued)

OTHER PUBLICATIONS

International Search Report, Aug. 22, 2002.

(Continued)

*Primary Examiner*—Tu-Tu Ho
(74) *Attorney, Agent, or Firm*—Carella Byrne Bain; Elliot M. Olstein; William Squire

(57) ABSTRACT

The invention relates to an organic field effect transistor with off-set threshold voltage. Said OFET has an intermediate layer that defines a space charge region between the insulator and the semiconductor.

14 Claims, 2 Drawing Sheets

U.S. PATENT DOCUMENTS

| | | | |
|---|---|---|---|
| 5,569,879 A | 10/1996 | Gloton et al. | |
| 5,574,291 A | 11/1996 | Dodabalapur et al. | |
| 5,578,513 A | 11/1996 | Maegawa | |
| 5,580,794 A | 12/1996 | Allen | |
| 5,625,199 A | 4/1997 | Baumbach et al. | |
| 5,630,986 A | 5/1997 | Charlton et al. | |
| 5,652,645 A | 7/1997 | Jain | |
| 5,691,089 A | 11/1997 | Smayling | |
| 5,705,826 A | 1/1998 | Aratani et al. | |
| 5,729,428 A | 3/1998 | Sakata et al. | |
| 5,854,139 A | 12/1998 | Aratani et al. | |
| 5,869,972 A | 2/1999 | Birch et al. | |
| 5,883,397 A | 3/1999 | Isoda et al. | |
| 5,892,244 A | 4/1999 | Tanaka et al. | |
| 5,967,048 A | 10/1999 | Fromson et al. | |
| 5,970,318 A | 10/1999 | Choi et al. | |
| 5,973,598 A | 10/1999 | Beigel | |
| 5,994,773 A | 11/1999 | Hirakawa | |
| 5,997,817 A | 12/1999 | Crismore et al. | |
| 5,998,805 A | 12/1999 | Shi et al. | |
| 6,036,919 A | 3/2000 | Thym et al. | |
| 6,045,977 A | 4/2000 | Chandross et al. | |
| 6,072,716 A | 6/2000 | Jacobsen et al. | |
| 6,083,104 A | 7/2000 | Choi | |
| 6,087,196 A | 7/2000 | Sturm et al. | |
| 6,133,835 A | 10/2000 | De Leeuw et al. | |
| 6,150,668 A | 11/2000 | Bao et al. | |
| 6,197,663 B1 | 3/2001 | Chandross et al. | |
| 6,207,472 B1 | 3/2001 | Calligari et al. | |
| 6,215,130 B1 | 4/2001 | Dodabalapur | |
| 6,221,553 B1 | 4/2001 | Wolk et al. | |
| 6,251,513 B1 | 6/2001 | Rector et al. | |
| 6,284,562 B1 | 9/2001 | Batlogg et al. | |
| 6,300,141 B1 | 10/2001 | Segal et al. | |
| 6,321,571 B1 | 11/2001 | Themont et al. | |
| 6,322,736 B1 | 11/2001 | Bao et al. | |
| 6,329,226 B1 | 12/2001 | Jones et al. | |
| 6,330,464 B1 | 12/2001 | Colvin et al. | |
| 6,335,539 B1 | 1/2002 | Dimitrakopoulos et al. | |
| 6,340,822 B1 | 1/2002 | Brown et al. | |
| 6,344,662 B1 | 2/2002 | Dimitrakopoulos et al. | |
| 6,362,509 B1 | 3/2002 | Hart | |
| 6,384,804 B1 | 5/2002 | Dodabalapur et al. | |
| 6,403,396 B1 | 6/2002 | Gudesen et al. | |
| 6,429,450 B1 | 8/2002 | Mutsaers et al. | |
| 6,498,114 B1 | 12/2002 | Amundson et al. | |
| 6,517,995 B1 | 2/2003 | Jacobsen et al. | |
| 6,555,840 B1 | 4/2003 | Hudson et al. | |
| 6,593,690 B1 | 7/2003 | McCormick et al. | |
| 6,603,139 B1 | 8/2003 | Tessler et al. | |
| 6,621,098 B1 | 9/2003 | Jackson et al. | |
| 6,852,583 B1 | 2/2005 | Bernds et al. | |
| 2002/0022284 A1 | 2/2002 | Haeger et al. | |
| 2002/0025391 A1 | 2/2002 | Angelopoulos et al. | |
| 2002/0053320 A1 | 5/2002 | Duthaler | |
| 2002/0056839 A1 | 5/2002 | Joo et al. | |
| 2002/0068392 A1 | 6/2002 | Lee et al. | |
| 2002/0130042 A1 | 9/2002 | Stiene | |
| 2002/0167003 A1* | 11/2002 | Campbell et al. | 257/40 |
| 2002/0170897 A1 | 11/2002 | Hall | |
| 2002/0195644 A1 | 12/2002 | Dodabalapur et al. | |
| 2003/0059987 A1 | 3/2003 | Henning et al. | |
| 2003/0112576 A1 | 6/2003 | Brewer et al. | |
| 2003/0175427 A1 | 9/2003 | Loo et al. | |
| 2004/0002176 A1 | 1/2004 | Xu | |
| 2004/0013982 A1 | 1/2004 | Jacobson et al. | |
| 2004/0026689 A1 | 2/2004 | Bernds et al. | |
| 2004/0084670 A1 | 5/2004 | Tripsas et al. | |
| 2004/0211329 A1 | 10/2004 | Funahata et al. | |

FOREIGN PATENT DOCUMENTS

| | | |
|---|---|---|
| DE | 4243832 | 6/1994 |
| DE | 198 52312 | 5/1999 |
| DE | 198 16 860 | 11/1999 |
| DE | 19918193 | 11/1999 |
| DE | 198 51703 | 5/2000 |
| DE | 19851703 | 5/2000 |
| DE | 100 06257 | 9/2000 |
| DE | 199 21024 | 11/2000 |
| DE | 19933757 | 1/2001 |
| DE | 69519782 | 1/2001 |
| DE | 199 35 527 | 2/2001 |
| DE | 199 37 262 | 3/2001 |
| DE | 100 12204 | 9/2001 |
| DE | 10033112 | 1/2002 |
| DE | 100 45 192 | 4/2002 |
| DE | 100 47 171 | 4/2002 |
| DE | 100 43204 | 4/2002 |
| DE | 100 58 559 | 5/2002 |
| DE | 10061297 | 6/2002 |
| DE | 101 20 687 | 10/2002 |
| DE | 102 19905 | 12/2003 |
| EP | 0 108650 | 5/1984 |
| EP | 0 128 529 | 12/1984 |
| EP | 0 268 370 A2 | 5/1988 |
| EP | 0 268 370 A3 | 5/1988 |
| EP | 0 350 179 | 1/1990 |
| EP | 0 418504 | 3/1991 |
| EP | 0 442123 | 8/1991 |
| EP | 0460242 | 12/1991 |
| EP | 0 528 662 | 8/1992 |
| EP | 0501456 A2 | 9/1992 |
| EP | 0501456 A3 | 9/1992 |
| EP | 0 511807 | 11/1992 |
| EP | 0 528662 | 2/1993 |
| EP | 0685985 | 12/1995 |
| EP | 0716458 | 6/1996 |
| EP | 0 786820 | 7/1997 |
| EP | 0962984 | 12/1999 |
| EP | 0966182 | 12/1999 |
| EP | 0 979715 | 2/2000 |
| EP | 0981165 A1 | 2/2000 |
| EP | 0989614 | 3/2000 |
| EP | 1 048 912 | 11/2000 |
| EP | 1 052 594 | 11/2000 |
| EP | 1065725 A2 | 1/2001 |
| EP | 1065725 A3 | 1/2001 |
| EP | 1 102 335 A2 | 5/2001 |
| EP | 1 104 035 A2 | 5/2001 |
| EP | 1 103916 | 5/2001 |
| EP | 1 134 694 | 9/2001 |
| EP | 1224999 | 7/2002 |
| EP | 1237207 | 9/2002 |
| EP | 1 318 084 | 6/2003 |
| FR | 2793089 | 11/2000 |
| GB | 723598 | 2/1955 |
| GB | 2 058 462 | 4/1981 |
| JP | 54069392 | 6/1979 |
| JP | 61167854 | 7/1986 |
| JP | 362065477 A | 3/1987 |
| JP | 05152560 | 6/1993 |
| JP | 05259434 | 10/1993 |
| JP | 05347422 | 12/1993 |
| JP | 08197788 | 8/1996 |
| JP | 2969184 B | 11/1999 |
| JP | 2001085272 | 3/2001 |
| WO | WO 93 16491 | 8/1993 |
| WO | WO 94/17556 | 8/1994 |
| WO | WO 95/06240 | 3/1995 |
| WO | WO 95 31831 | 11/1995 |
| WO | WO 95 31831 | 12/1995 |
| WO | WO 96 02924 | 2/1996 |

| | | |
|---|---|---|
| WO | WO 97/12349 | 4/1997 |
| WO | WO 97/18944 | 5/1997 |
| WO | WO 09718944 | 5/1997 |
| WO | WO 98 18186 | 4/1998 |
| WO | WO9818156 | 4/1998 |
| WO | WO 98/40930 | 9/1998 |
| WO | WO 99/07189 | 2/1999 |
| WO | WO 99/10929 | 3/1999 |
| WO | WO 99 10939 | 3/1999 |
| WO | WO 99 21233 | 4/1999 |
| WO | WO 99 30432 | 6/1999 |
| WO | WO 99 39373 | 8/1999 |
| WO | WO 99 40631 | 8/1999 |
| WO | WO 99 54936 | 10/1999 |
| WO | WO 9954936 | 10/1999 |
| WO | WO 99/66540 | 12/1999 |
| WO | WO 00/33063 | 6/2000 |
| WO | WO 00/36666 | 6/2000 |
| WO | WO 01/03126 | 1/2001 |
| WO | WO 01/06442 | 1/2001 |
| WO | WO 0108241 | 2/2001 |
| WO | WO 01 15233 | 3/2001 |
| WO | WO 01/15233 | 3/2001 |
| WO | WO 01/17029 | 3/2001 |
| WO | WO 01 17041 | 3/2001 |
| WO | WO 01/27998 | 4/2001 |
| WO | WO 01/46987 | 6/2001 |
| WO | WO 01/47044 | 6/2001 |
| WO | WO 01 47045 | 6/2001 |
| WO | WO 0147044 A2 | 6/2001 |
| WO | WO 0147044 A3 | 6/2001 |
| WO | WO 0173109 A2 | 10/2001 |
| WO | WO 0173109 A3 | 10/2001 |
| WO | WO 0205361 | 1/2002 |
| WO | WO 02/15264 | 2/2002 |
| WO | WO 02 19443 | 3/2002 |
| WO | WO 02/29912 | 4/2002 |
| WO | WO 02/43071 | 5/2002 |
| WO | WO 02/47183 | 6/2002 |
| WO | WO 0247183 | 6/2002 |
| WO | WO 02/065557 | 8/2002 |
| WO | WO 02/071139 | 9/2002 |
| WO | WO 02/071505 | 9/2002 |
| WO | WO 02/076924 | 10/2002 |
| WO | WO 02/091495 | 11/2002 |
| WO | WO 02/095805 | 11/2002 |
| WO | WO 02/095805 A3 | 11/2002 |
| WO | WO 02095805 A2 | 11/2002 |
| WO | WO 02/099908 | 12/2002 |
| WO | WO 0299907 | 12/2002 |
| WO | WO 03/046922 | 6/2003 |
| WO | WO 03/069552 | 8/2003 |
| WO | WO 03067680 | 8/2003 |
| WO | WO 03/081671 | 10/2003 |
| WO | WO 03/095175 | 11/2003 |
| WO | WO 2004/032257 | 4/2004 |
| WO | WO 2004/042837 | 5/2004 |
| WO | WO 04042837 | 5/2004 |
| WO | WO 0407194 A2 | 6/2004 |
| WO | WO 0407194 A3 | 6/2004 |
| WO | WO 04047144 A2 | 6/2004 |
| WO | WO 04047144 A3 | 6/2004 |
| WO | WO 2004/083859 | 9/2004 |
| WO | WO 00 79617 | 12/2004 |

OTHER PUBLICATIONS

Garnier F et al:, "Vertical Devices Architecture By Molding Of Organic-Based Thin Film Transistor", Applied Physics Letters, American Institute Of Physics. XP000784120, issn: 0003-6951 abbildung 2.

Collet J. et al:, Low Voltage, 30 NM Channel Length, Organic Transistors with a Self-Assembled Monolayer as Gate Insulating Films:, Applied Physics Letters, American Institute of Physics. New York, US, Bd 76, Nr. 14, (Apr. 3, 2000), Seiten 1941-1943, XP000950589, ISSN:0003-6951, das ganze Dokument.

Hwang J D et al:, "A Vertical Submicron SIc thin transistor", Solid State Electronics, Elsevier Science Publishers, Barking, GB, Bd. 38, NR. 2, (Feb. 1, 1995), Seiten 275-278, XP004014040, ISSN:0038-1101 Abbildung 2.

Rogers J A et al:, "Low-Voltage 0.1 Mum Organic Transistors and Complementary Inverter Circuits Fabricated with a Low-Cost Form of Near-Field Photolithography", Applied Physics Letters, American Institute of Physics. New York, US, Bd. 75, Nr. 7, (Aug. 16, 1999), Seiten 1010-1012, XP000934355, ISSN:003-6951, das ganze Dokument.

"Short-Channel Field-Effect Transistor", IBM Technical Disclosure Bulletin, IBM Corp., New York, US, Bd. 32, Nr. 3A, (Aug. 1, 1989), Seiten 77-78, XP000049357, ISSN:0018-8689, das ganze Dokument.

Redecker, M. et al., "Mobility enchancement through homogeneous nematic alignment of a liquid-crystalline polyfluorene", 1999 American Institute of Physics, Applied Physics Letters, vol. 74, No. 10, pp. 1400-1402.

Rogers, J. A. et al:, "Printing Process Suitable for Reel-to-Reel Production of High-Performance Organic Transistors and Circuits", Advanced Materials, VCH, Verlagsgesellschaft, Weinheim, DE, Bd. 11, Nr. 9, (Jul. 5, 1999), Seiten 741-745, P000851834, ISSN: 0935-9648, das ganze Dokument.

Miyamoto, Shoichi et al:, Effect of LDD Structure and Channel Poly-Si Thinning on a Gate-All-Around TFT (GAT) for SRAM's, IEEE Transactions on Electron Devices. vol. 46, No. 8, Aug. 1999.

Kumar, Anish et al:, "Kink-Free Polycrystalline Silicon Double-Gate Elevated-Channel Thin-Film Transistors", IEEE Transactions on Electron Devices, vol. 45, No. 12, Dec. 1998.

Chen, Shiao-Shien et al:, "Deep Submicrometer Double-Gate Fully-Depleted SOI PMOS Devices: A Concise Short-Channel Effect Threshold Voltage Model Using a Quasi-2D Approadh", IEEE Transaction on Electron Devices, vol. 43, No. 9, Sep. 1996.

Zangara L: "Metall Statt Halbleiter, Programmierung Von Embedded ROMS Ueber Die Metallisierungen", Elektronik, Franzis Verlag GMBH, Munchen, DE, Bd. 47, Nr. 16, (Aug. 4, 1998), Seiten 52-55, XP000847917, ISSN: 0013-5658, Seite 52, rechtes Plate, Zeile 7-Seite 53, linke Spalte, Zeile 14; Abbildungen 1, 2.

Hergel, H. J.: "Ptd-Programmiertechnologien", Elektronik, Franzis Verlag GMBH. Munchen, DE, Bd 41, Nr. 5, (Mar. 3, 1992), Seiten 44-46, XP000293121, ISSN: 0013-5658, Abbildungen 1-3.

Forrest et al.: "The Dawn of Organic Electronics", IEEE Spectrum, (Aug. 2000), Seiten 29-34, XP002189000, IEEE Inc., New York, US ISSN:0018-9235, Seite 33, rechte Spalte, Zeile 58-Seite 34, linke Spalte, Zeile 24; Abbildung 5.

Patent Abstracts of Japan, vol. 009, No. 274 (E-354), (Oct. 31, 1985) & JP 60 117769 A (Fujitsu KK), (Jun. 25, 1985) Zusammenfassung.

Zie Voor Titel Boek, de 2e Pagina, XP-002189001, PG 196-228.

Drury et al., "Low-Cost All-Polymer Integrated Circuits", American Institute of Physics, Applied Physics Letters, 1998, vol. 73, No. 1, pp. 108-110, Jul. 6, 1998.

Kuhlmann et al., "Terabytes in Plastikfolie", Organische Massenspeicher vor der Serienproduktion.

Garnier, F. et al, "All-Polymer Field-Effect Transistor Realized by Printing Techniques", Science, American Association for the Advancement of Science, US, vol. 265, Sep. 16, 1994, pp. 1684-1686.

Assadi A, et al:, Field-Effect Mobility of Poly (3-Hexylthiophene) Dept. of Physics and Measurement Technology, Received Mar. 3, 1988; accepted for Publication May 17, 1988.

Bao, Z. et al., "High-Performance Plastic Transistors Fabricatecd by Printing Techniques", Chem. Mater vol. 9, No. 6, 1997, pp. 1299-1301.

Hebner, T.R. et al., ink-jet printing of doped polymers for organic light emitting devices:, American Institute of Physics, Applied Physics Letters, vol. 72, No. 5, Feb. 2, 1998, pp. 519-521.

Angelopoulos M et al, "In-Situ Radiation Induced Doping", Mol. Cryst. Liq. Cryst. 1990, vol. 189, pp. 221-225.

Dai, L. et al, Photochemical Generation of Conducting Pattersn in Polybutadiene Films:, Macromolecules, vol. 29, No. 1, 1996, pp. 282-287, XP 001042019, the whole document.

Roman et al., Polymer Diodes with High Rectification:, Applied Physics Letters, vol. 75, No. 21, Nov. 22, 1999.

Patent Abstracts of Japan, vol. 010, No. 137, May 21, 1986 (JP 361001060A).

Schoebel, "Frequency Conversion with Organic-On-Inorganic Heterostructured Diodes", Extended Abstracts of the International Conference on Solid State Devices and Materials, Sep. 1, 1997.

Braun D., et al, "Visible light emission from semiconducting polymer diodes", American Institute of Physics, Applied Physics Letters 58, May 6, 1991, pp. 1982-1984.

Yu, G. et al., "Dual-function semiconducting polymer devices: Light-emitting and photodetecting diodes", American Institute of Physics, Applied Physics Letter 64, Mar. 21, 1994, pp. 1540-1542.

Lucent Technologies, "Innovation marks significant milestone in the development of electronic paper", Cambridge, MA and Murray Hill, NJ, Nov. 20, 2000. XP-002209726.

Garnier et al., "Conjugated Polymers and Oligomers as Active Material For Electronic Devices", Synthetic Metals, vol. 28, 1989.

Gelinck, G.H. et al., "High-Performance All-Polymer Integrated Circuits", Applied Physics Letters, v. 77, 2000, pp. 1487-1489.

Zheng, Xiang-Yang et al., "Electrochemical Patterning of the Surface of Insulators with Electrically Conductive Polymers", J. Electrochem. Soc., v. 142, 1995, pp. L226-L227.

Lidzey, D. G. et al., "Photoprocessed and Micropatterned Conjugated Polymer LEDs", Synthetic Metals, V. 82, 1996, pp. 141-148.

Kobel W. et al., "Generation of Micropatterns in Poly (3-Methyl-Thiophene) Films Using Microlithography: A First Step in the Design of an All-Organic Thin-Film Transistor" Synthetic Metals, V. 22, 1988, pp. 265-271.

Rost, Henning et al., "All-Polymer Organic Field Effect Transistors", Proc. Mat. Week, CD, 2001, pp. 1-6.

Manuelli, Alessandro et al., "Applicability of Coating Techniques for the Production of Organic Field Effect Transistors", IEEE Polytronic 2002 Conference, 2002, pp. 201-204.

Ullman, A. et al., "High Performance Organic Field-Effect Transistors and Integrated Inverters", Mat. Res. Soc. Symp. Proc., v. 665, 2001, pp. 265-270.

Fix, W. et al., "Fast Polymer Integrated Circuits Based on a Polyfluorene Derivative", ESSDERC 2002, 2002, pp. 527-529.

Knobloch, A. et al., "Printed Polymer Transistors", Proc. Polytronic, v. 84, 2001, pp. 84-89.

Ficker, J. et al., "Dynamic and Lifetime Measurements of Polymer OFETS and Integrated Plastic Circuits," Proc. of SPIE, v. 466, 2001, pp. 95-102.

Clemens, W. et al., "Vom Organischen Transistor Zum Plastik-Chip," Physik Journal, V. 2, 2003, pp. 31-36.

Crone, B. et al, "Large-scale complementary Integrated circuits based on Organic transistors", Nature, vol. 403, Feb. 3, 2000, pp. 521.

Fix, W., et al., "Fast polymer integrated circuits", American Institute of Physics, Applied Physics Letters, vol. 81, No. 89, Aug. 2002, pp. 1735-1737.

Dodabalapur, A. et al., Organic smart pixels, American Institute of Physics, Applied Physics Letters, vol. 73, No. 2, Jul. 13, 1998, pp. 142-144.

Halls, J.J. M., et al., "Efficient photodiodes from interpenetrating polymer networks", Nature, vol. 376, Aug. 10, 1995, pp. 498-500.

Brown, A.R. et al., "Field-effect transistors made from solution-processed organic semiconductors", Elsevier Science, S.A., Synthetic Metals 88 (1997) pp. 37-55.

Brown, A.R., "Logic Gates Made from Polymer Transistors and Their Use in Ring Oscillators", Science, vol. 270, Nov. 10, 1995, pp. 972-974.

Klauk, H. et al., "Pentacene Thin Film Transistors and Inverter Circuits", 1997 International Exectron Devices Meeting Technical Digest, pp. 539-542, Dec. 1997.

Klauk, H. et al., "Fast Organic Thin Film Transistor Circuits", IEEE Electron Device Letters, vol. 20, No. 6, pp. 289-291.

Bao, Z. et al., "Organic and Polymeric Materials for the Fabrications of Thin Film Field-Effect Transistors", paper presented at the meeting of American Chemical Society, Division of Polymer Chemistry, XX, XX, Bd. 39, Nr. 1, (Mar. 29, 1998), P001032497, ISSN: 0032-3934 das ganze Dokument.

Patent Abstracts of Japan, vol. 013, No. 444 (E-828), (Oct. 5, 1989) & JP 01 169942 A (Hitachi Ltd), Jul. 5, 1989.

Oelkrug, D. et al., "Electronic spectra of self-organized oligothiophene films with 'standing' and 'lying' molecular units", Elsevier Science S.A., 1996, Thin Solid Films 284-270.

Sandberg, H. et al, "Ultra-thin Organic Films for Field Effect Transistors", SPIE vol. 4466, 2001, pp. 35-43.

Chen, X.L. et al., "Morphological and Transistor Studies of Organic Molecular Semiconductors with Anisotropic Electrical Characteristics", American Chemical Society, 2001, Chem. Mater. 2001, 13, 1341-1348.

De Leeuw D.M. et al., "Polymeric integrated circuits and light-emitting diodes", Electron Devices Meeting, 1997. Technical Digest, International, Washington, DC, USA Dec. 7-10, 1997, New York, NY, USA, IEEE, US Dec. 7, 1997.

Lowe, J. et al., "Poly(3—(2—Acetoxyethyl)Thiophene): A Model Polymer for Acid-Catalyzed Lithography", Synthetic Metals, Elsevier Sequoia, Lausanne, CH, Bd. 85, 1997, Seiten 1427-1430.

Schrodner M. et al., "Plastic electronics based on Semiconducting Polymers", First International IEEE Conference on Polymers and Adhesives in Microelectronics and Photonics. Incorporating Poly, Pep & Adhesives in Electronics. Proceedings (Cat. No. 01TH8592), First International IEEE Conference on Polymers and Adhesives in Micr, Seitenn 91-94.

Harsanyi G. et al, "Polytronics for biogtronics:unique possibilities of polymers in biosensors and BioMEMS", IEEE Polytronic 2002 Conference, Jun. 23, 2002, pp. 211-215.

Koezuka, H. et al., "Macromolecular Electronic Device", Mol. Cryst. Liq. Cryst. 1994, vol. 2555, pp. 221-230.

U.S. Appl. No. 10/344,951, Adolf Bernds et al.
U.S. Appl. No. 10/362,932, filed Oct. 2, 2003, Adolf Bernds et al.
U.S. Appl. No. 10/380,113, filed Sep. 25, 2003, Adolf Bernds et al.
U.S. Appl. No. 10/380,206, Adolf Bernds et al.
U.S. Appl. No. 10/381,032, Adolf Bernds et al.
U.S. Appl. No. 10/433,959, Adolf Bernds.
U.S. Appl. No. 10/433,961, Wolfgang Clemens et al.
U.S. Appl. No. 10/451,108, Mark Giles et al.
U.S. Appl. No. 10/467,636, Adolf Bernds et al.
U.S. Appl. No. 10/473,050, Adolf Bernds et al.
U.S. Appl. No. 10/479,234, filed Dec. 30, 2004, Adolf Bernds et al.
U.S. Appl. No. 10/479,238, Adolf Bernds et al.
U.S. Appl. No. 10/492,922, Erwann Buillet et al.
U.S. Appl. No. 10/492,923, filed Dec. 23, 2004, Wolfgang Clemens et al.
U.S. Appl. No. 10/498,610, Walter Fix et al.
U.S. Appl. No. 10/508,640, Walter Fix et al.
U.S. Appl. No. 10/508,737, Adolf Bernds et al.
U.S. Appl. No. 10/517,750, Wolfgang Clemens et al.
U.S. Appl. No. 10/523,216, Adolf Bernds et al.
U.S. Appl. No. 10/523,487, Wolfgang Clemens et al.
U.S. Appl. No. 10/524,646, Walter fix et al.

Fraunhofer Magazin Nr. 4, 2001, Seiten 8-13, XP002257822 das ganze Dokument.

U.S. Appl. No. 10/533,756, Wolfgang Clemens et al.
U.S. Appl. No. 10/534,678, Wolfgang Clemens et al.
U.S. Appl. No. 10/535,448, Wolfgang Clemens et al.
U.S. Appl. No. 10/535,449, Adolf Bernds et al.
U.S. Appl. No. 10/344,926, Wolfgang Clemens et al.
U.S. Appl. No. 10/541,815, Axel Gerlt et al.
U.S. Appl. No. 10/541,956, Wolfgang Clemens et al.
U.S. Appl. No. 10/541,957, Walter Fix et al.

Brabec, C.J. et al, "Photoinduced FT-IR spectroscopy and CW-photocurrent measurements of conjugated polymers and fullerenes blended into a conventional polymer matrix", Solar Energy Materials and Solar Cells, 2000 Elsevier Science V.V., pp. 19-33.

Brabec, C.J. et al., "Photovoltaic properties of a conjugated polymer/methanofullerene composites embedded in a polystyrene matrix", Journal of Applied Physics, vol. 85, No. 9, 1999, pp. 6866-6872.

Gosain, D.P., "Excimer laser crystallized poly-Si TFT's on plastic substrates", Second International Symposium on Laser Precision Microfabrication, May 16-18, 2001, Singapore, vol. 4426, pp. 394-400.

Lu, Wen et al., "Use of Ionic Liquids for $\pi$-Conjugated Polymer Electrochemical Devices", Science, vol. 297, 2002, pp. 983-987/.

Shaheen, S.E., et al., "Low band-gap polymeric photovoltaic devices", Synthetic Metals, vol. 121, 2001, pp. 1583-1584.

Takashima, W. et al., Electroplasticity Memory Devices Using Conducting Polymers and Solid Polymer Electrolytes, Polymer International, Melbourne, 1992, pp. 249-253.

Velu, G. et al. "Low Driving Voltages and Memory Effect in Organic Thin-Film Transistors With A Ferroelectric Gate Insulator", Applied Physics Letters, American Institute of Physics, New York, Vo.l 79, No. 5, 2001, pp. 659-661.

Wang, Hsing et al., "Conducting Polymer Blends: Polythiophene and Polypyrrole Blends with Polystyrene and Poly(bisphenol A carbonate)", Macromolecules, 1990, vol. 23, pp. 1053-1059.

Wang, Yading et al., "Electrically Conductive Semiinterpenetrating Polymer Networks of Poly(3-octylthiophene)", Macromolecules 1992, vol. 25, pp. 3284-3290.

U.S. Appl. No. 10/543,561, Wolfgang Clemens et al.
U.S. Appl. No. 10/542,678, Adolf Bernds et al.
U.S. Appl. No. 10/542,679, Adolf Bernds et al.

* cited by examiner

ORGANIC FIELD EFFECT TRANSISTOR WITH OFF-SET THRESHOLD VOLTAGE AND THE USE THEREOF

This application is a 371 of PCT/DE02/04520, Sep. 12, 2002, which claims benefit of Germany application 101 60 732.6, filed Dec. 11, 2001

Organic field effect transistor with offset threshold voltage and the use thereof The invention relates to an organic field effect transistor with offset threshold voltage.

A key parameter in the case of organic field effect transistors (OFETs) is the position of the threshold voltage. This voltage indicates the, gate voltage at which the current channel of the transistor originates or becomes conductive. If it is around 0V, two problems arise when setting up integrated circuits from these OFETs: two voltage supplies are required instead of one and roughly double the number of transistors are needed, as the output voltages of the logic elements have to be offset, before they can be used to activate further logic elements. The result of these problems is for example a significant increase in power consumption, which complicates the use of polymer electronics, i.e. electronics based on organic materials, for applications such as RF-ID (radio frequency identification) tags.

In the case of the most promising OFETS for future applications, those based on polyalkylthiophene, as known for example from the publication by H. Sirringhaus (H. Sirringhaus, N. Tessler, et al. (1999). Elsevier Synthetic Metals 102: 857–860), the threshold voltage is around 0V. In the case of OFETs with pentacene as the semiconductor, the threshold voltage is even at positive voltages (C. D. Sheraw, J. A. Nichols et al. (2000), IEDM 20-00, p. 619–22). The problems set out above therefore result. As OFETs are based on the principle of charge carrier accumulation, the position of the threshold voltage cannot be adjusted by means of the channel thickness, as is usually the case for example with Si-MOS-FETs (silicon metal oxide field effect transistors). Even a thicker insulator layer only offsets the threshold voltage to an insignificant extent. It would also have a significantly detrimental effect on the on/off relationship of the OFETs at the same time. The obvious option for offsetting the threshold voltage, namely using a gate electrode, which has a lower work function, is not a feasible solution, as in practice these cannot be made from a conductive organic material.

The object of the invention is therefore to provide an option for offsetting the threshold voltage in OFETs, in particular in those with a threshold voltage close to 0V or in the positive range. The object of the invention is also to disclose uses for OFETs with an offset threshold voltage.

The object of the invention is an OFET comprising at least a substrate, structured source/drain electrodes, which are embedded in an organic semiconductor layer, adjacent to which are an insulator layer and a gate electrode, whereby there is an intermediate layer between the semiconductor layer and the insulator layer that defines a space charge region there.

The "space charge region" is an area in which there are no free charge carriers.

The intermediate layer generates a space charge region, which prevents the formation of a conductive current channel at low gate voltages. Normal generation of a current channel only takes place at higher gate voltages. This means that the threshold voltage is offset without disadvantages such as deterioration of the ON/OFF relationship, etc. or lower output currents. Whether the threshold voltage offset is 2V, 5V or over 10V depends on the thickness and donor concentration of the intermediate layer and can be adjusted as required by means of an appropriate selection. This represents an important advantage of the invention disclosure.

A further advantage of the invention is that OFETs with such an intermediate layer are significantly less susceptible to unintentional background doping of the semiconductor, as this is actively compensated for by the intermediate layer. This simplifies OFET production, as they do not have to be produced subject to oxygen exclusion.

According to one embodiment, the intermediate layer is made from small, polarizable molecules with internal dipole moment (e.g. disulfide dipole molecules) or silanes, fullerenes or perylenes.

According to one embodiment, the intermediate layer is a few to several 10s of nanometers thick.

When producing organic transistors or organic integrated circuits, the intermediate layer can either be applied to the semiconductor layer (in the case of top gate OFETs) or the insulator layer (in the case of bottom gate OFETs). Application can be effected by centrifuging, casting, printing, vapor, immersion in a solution or another application method.

The invention can be used with both positively conductive and negatively conductive OFETs. As however the focus of interest is on negatively conductive OFETs at present, the description below, based on figures showing exemplary embodiments of the invention, is restricted to positively conductive OFETs.

BRIEF DESCRIPTION OF THE DRAWINGS

FIG. 1a shows a cross-section through a conventional OFET with a substrate 8 (e.g. a plastic film), the structured source/drain electrodes 7, the organic semiconductor layer 6, the insulator layer 2 and the gate electrode 1. FIG. 1b shows the associated position of the LUMO and HOMO energies for the layer sequence gate electrode/insulator/semiconductor: LUMO energy 3 (corresponds to the energy position of the conduction band), HOMO energy 5 (corresponds to the energy position of the valence band) and the Fermi level 4. An increase in the gate voltage of $\Delta U_1$ results in an accumulation of charge carriers at the interface between insulator and semiconductor (9 in FIG. 1c). This leads to an increase in the energy level in the organic semiconductor layer 6 close to the interface. The increase in gate voltage therefore results directly in the formation of a current channel 9 in the OFET.

FIG. 2a shows the structure of an OFET according to one embodiment of the invention. The space charge generating layer 10 is located between the insulator layer 2 and the semiconductive layer 10. The main properties of this layer are a low work function, a Fermi level close to the LUMO 3 and a high number of donors. These properties mean that the charge carriers of the adjacent semiconductor layer are tied to these donors. This results in the definition of a space charge region, i.e. an area in which there are no free charge carriers. In FIG. 2b this space charge region is identified by the downward curving LUMO and HOMO levels 3 and 4 close to the semiconductor/insulator interface. If the gate voltage is increased to this OFET, a current channel still cannot be generated at low voltages, as it is first necessary to fill all the donors with holes. Only at a higher voltage $\Delta U_2$, when the donors are compensated for, can a current channel 9 be generated in the OFET (see FIG. 2c). The difference between the voltage $\Delta U_1$ (in FIG. 1c) and $\Delta U_2$ (in FIG. 2c) corresponds to the threshold voltage offset.

Figure 1A:
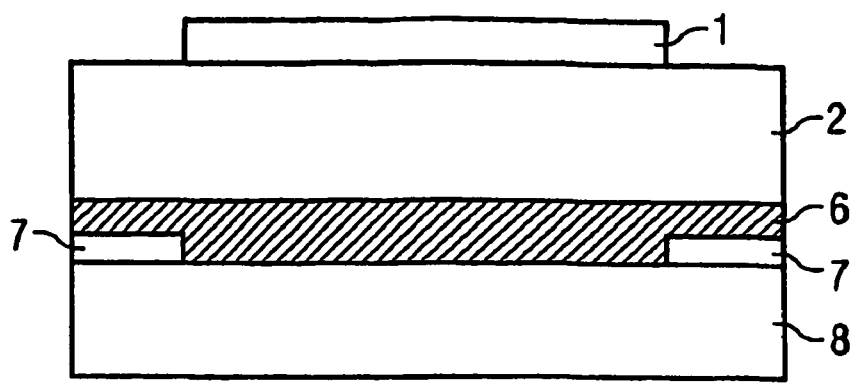
FIGS. 1a to 1c show the prior art for comparison.
Figure 1B:
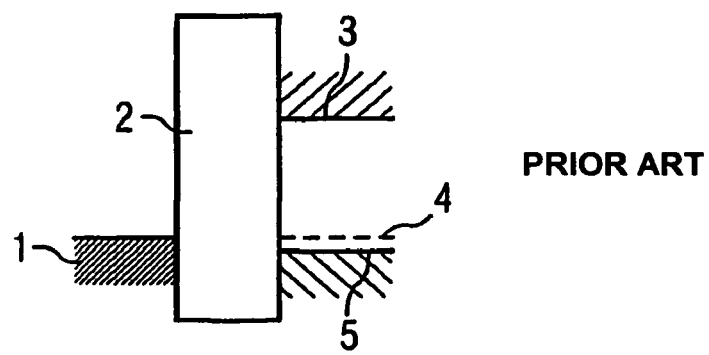
Figure 1C:
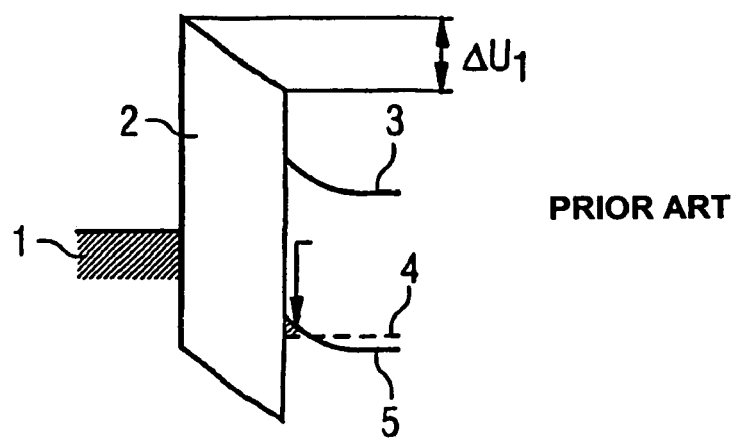
Figure 2A:
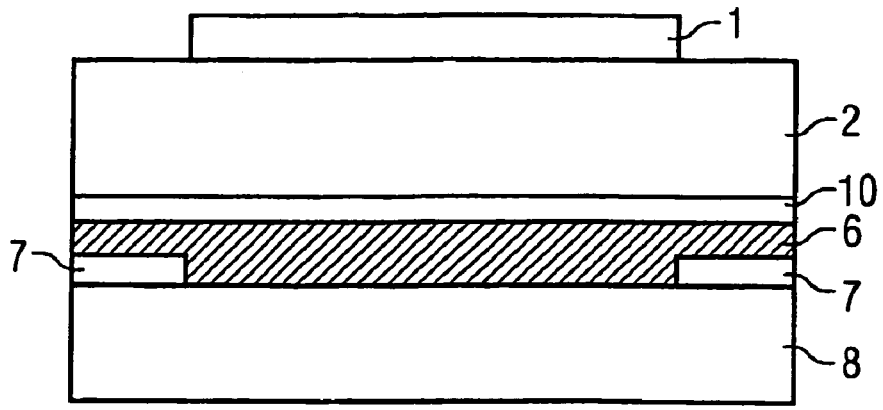
FIGS. 2a to 2c show the same views for an exemplary embodiment of the invention.
Figure 2B:
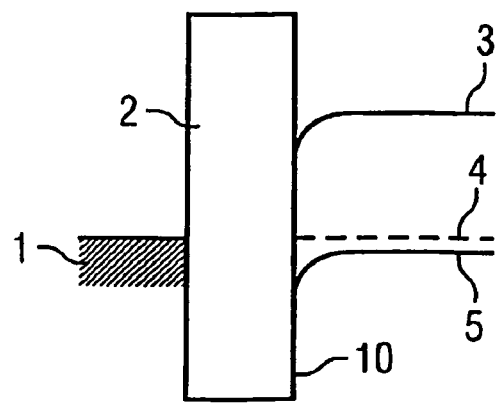
Figure 2C:
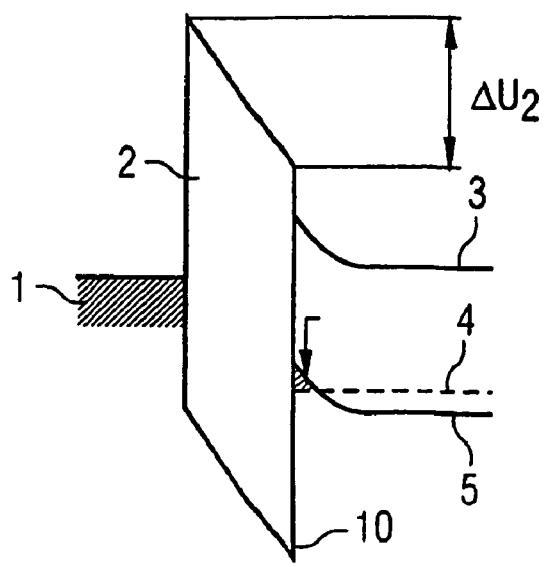

The subject matter of the invention is the insertion of a very thin, nonconductive layer between the semiconductive material and the insulator in the OFET. The invention allows the threshold voltage of an OFET to be offset for the first time and the production of the OFET to be simplified at the same time, as there is no need for oxygen exclusion during production.

The invention claimed is:

1. An OFET, having a threshold voltage, comprising:
   a substrate;
   an active semiconductor layer; and
   an intermediate layer adjacent to the active semiconductive layer, which intermediate layer offsets the threshold voltage of the OFET by defining a space charge region in the active layer.

2. OFET according to claim 1, whereby the intermediate layer is located between the substrate and the active layer.

3. OFET according to claim 1, including a gate insulation layer, whereby the intermediate layer is located between the active layer and the gate insulator layer.

4. OFET according to one of claims 1, 2 or 3, whereby the intermediate layer consists of small, polarizable molecules with internal dipole moment (e.g. disulfide dipole molecules) or of silanes, fullerenes or perylenes.

5. OFET according to claim 1 which has a threshold voltage in the range −1V to −10V.

6. OFET according to claim 1 wherein the semiconductive material of which is polyalkylthiophene.

7. OFET according to claim 1 wherein the intermediate layer has a thickness in the range 1 to 50 nm.

8. Use of the OFET according to claim 1 in an RFID tag, a sensor array, a photovoltaic cell, as a "wearable electronic", as an active display, as an electronic bar code for consumer goods, as an electronic watermark, as an electronic stamp, as a baggage label and/or as an electronic ticket.

9. Use of the OFET according to claim 2 in an RFID tag, a sensor array, a photovoltaic cell, as a "wearable electronic", as an active display, as an electronic bar code for consumer goods, as an electronic watermark, as an electronic stamp, as a baggage label and/or as an electronic ticket.

10. Use of the OFET according to claim 3 in an RFID tag, a sensor array, a photovoltaic cell, as a "wearable electronic", as an active display, as an electronic bar code for consumer goods, as an electronic watermark, as an electronic stamp, as a baggage label and/or as an electronic ticket.

11. Use of the OFET according to claim 4 in an RFID tag, a sensor array, a photovoltaic cell, as a "wearable electronic", as an active display, as an electronic bar code for consumer goods, as an electronic watermark, as an electronic stamp, as a baggage label and/or as an electronic ticket.

12. Use of the OFET according to claim 5 in an RFID tag, a sensor array, a photovoltaic cell, as a "wearable electronic", as an active display, as an electronic bar code for consumer goods, as an electronic watermark, as an electronic stamp, as a baggage label and/or as an electronic ticket.

13. Use of the OFET according to claim 6 in an RFID tag, a sensor array, a photovoltaic cell, as a "wearable electronic", as an active display, as an electronic bar code for consumer goods, as an electronic watermark, as an electronic stamp, as a baggage label and/or as an electronic ticket.

14. Use of the OFET according to claim 7 in an RFID tag, a sensor array, a photovoltaic cell, as a "wearable electronic", as an active display, as an electronic bar code for consumer goods, as an electronic watermark, as an electronic stamp, as a baggage label and/or as an electronic ticket.

* * * * *